(12) United States Patent
Mayet

(10) Patent No.: US 11,388,204 B2
(45) Date of Patent: Jul. 12, 2022

(54) TEST OR MEASUREMENT INSTRUMENT AND METHOD

(71) Applicant: Rohde & Schwarz GmbH & Co. KG, Munich (DE)

(72) Inventor: Ferdinand Mayet, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 179 days.

(21) Appl. No.: 16/821,027

(22) Filed: Mar. 17, 2020

(65) Prior Publication Data

US 2020/0351311 A1 Nov. 5, 2020

(30) Foreign Application Priority Data

Apr. 30, 2019 (EP) .................................. 19171844

(51) Int. Cl.
*G06K 7/14* (2006.01)
*H04L 65/1069* (2022.01)
*G06K 19/06* (2006.01)

(52) U.S. Cl.
CPC ........ *H04L 65/1069* (2013.01); *G06K 7/1413* (2013.01); *G06K 7/1417* (2013.01); *G06K 19/06028* (2013.01); *G06K 19/06037* (2013.01)

(58) Field of Classification Search
CPC ........... G06K 7/1417; G06K 19/06028; G06K 19/06037
USPC ....................................................... 235/494
See application file for complete search history.

(56) References Cited

U.S. PATENT DOCUMENTS

| | | | | |
|---|---|---|---|---|
| 2010/0325490 | A1* | 12/2010 | Anvin ................. | G06F 11/0778 714/37 |
| 2014/0085309 | A1* | 3/2014 | Czapar ................... | G06F 3/147 345/441 |
| 2014/0107976 | A1* | 4/2014 | Kallfelz ............... | G01R 31/371 702/182 |

FOREIGN PATENT DOCUMENTS

| | | |
|---|---|---|
| CN | 202939195 U | 5/2013 |
| DE | 102009055093 A1 | 6/2011 |
| DE | 102014112033 A1 | 2/2016 |

OTHER PUBLICATIONS

Extended European search report for European Patent Application No. 19171844.4, dated Oct. 22, 2019, search completed Oct. 15, 2019, 8 pages.

(Continued)

*Primary Examiner* — Paultep Savusdiphol
(74) *Attorney, Agent, or Firm* — Westman, Champlin & Koehler, P.A.

(57) ABSTRACT

The present invention relates to a test or measurement instrument, comprising a test unit, a memory, a display, a network interface and a processing unit. The processing unit is configured to generate a machine-readable representation of data such as a QR code which comprises encoded address information of the data file stored in the memory. The processing unit is further configured to display the generated QR code on the display for enabling an external network device to download the stored data file via the network interface after having scanned the displayed QR code and decoded the address information encoded therein. The invention further relates to a method for enabling a network device to downloaded data stored in a test or measurement instrument.

18 Claims, 2 Drawing Sheets

(56) References Cited

OTHER PUBLICATIONS

Indian Patent Application No. IN2012CH04474, which was filed on Oct. 26, 2012, and published as IN4474/CHE/2012, 15 pages.

* cited by examiner

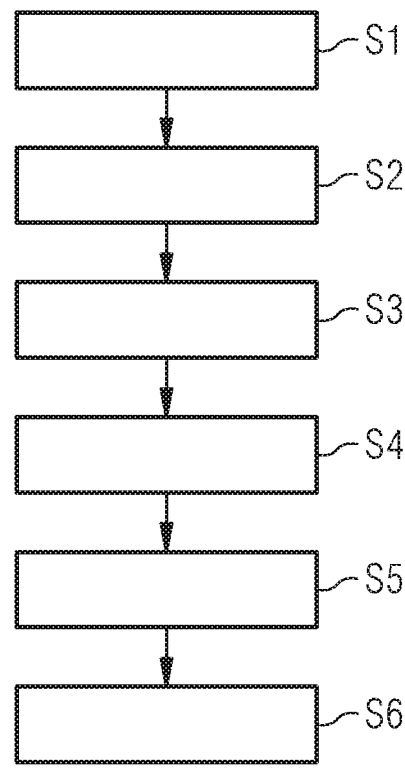
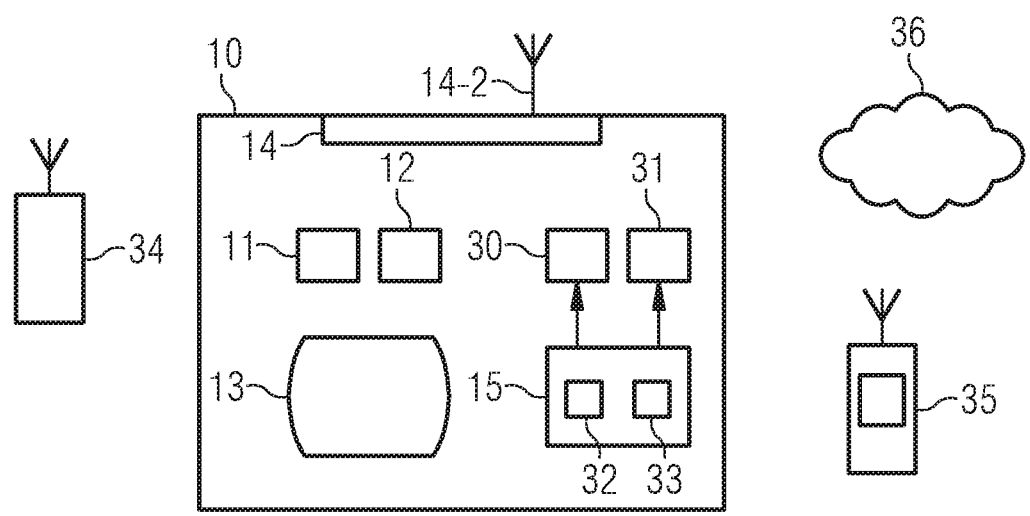

TEST OR MEASUREMENT INSTRUMENT AND METHOD

CROSS-REFERENCE TO RELATED APPLICATION

This application claims priority to European Patent Application No. 19171844.4, filed on Apr. 30, 2019, the content of which is hereby incorporated by reference.

FIELD OF THE INVENTION

The present invention relates to a test or measurement instrument. The invention further relates to a method for enabling a network device to downloaded data stored in a test or measurement instrument.

TECHNICAL BACKGROUND

Measuring and test instruments are generally known, so that their design and function need not be discussed in detail. A measuring instrument is a device for measuring a physical parameter, such as voltage, current, frequency, etc. Measuring instruments are often used for testing purposes. Although this invention can be applied to any measuring or testing instrument, it is explained below using a test device, but without limiting the invention to it.

In the course of the testing, test devices typically create test data which are displayed on the display of the test device. The test data may also be collected in test data files which can be suitably stored by the user on the test device. Additionally, the user often wants to transfer the obtained test data to a different device, e.g. for documentation or analysis purposes or for further processing this information.

In order to transfer the obtained data to other devices, one may use a suitable remote command, such as SCPI (Standard Command for Programmable Instruments) which is a standardized set of command for controlling and programming measuring instruments. Another option is connecting a suitable data medium, such as u USB memory stick, to the test device for the data transfer. However, transferring the obtained data via a memory stick or using a remote command is not always possible and can be annoying.

SUMMARY OF THE INVENTION

Against this background, there is the need to enable a more user comfortable option for transferring data from a test or measurement instrument to another device.

The present invention provides a test or measurement instrument and a method having the features of the independent claims.

According thereto, the following is provided:

A test or measurement instrument, comprising: a memory configured to store at least one data file; a display configured to display a machine-readable representation of data; a network interface for connecting the test or measurement instrument to another network device; and a processing unit connected to the display, the memory and the network interface, wherein the processing unit is configured to generate a machine-readable representation of data which comprises encoded address information of the data file stored in the memory and wherein the processing unit is further configured to display the generated machine-readable representation of data on the display for enabling the network device to download the stored data file via the network interface after having scanned the displayed machine-readable representation of data and decoded the address information.

A method for enabling a network device to downloaded data stored in a test or measurement instrument, the method comprising the steps of: storing at least one data file in the test or measurement instrument; generating a machine-readable representation of data which comprises encoded address information of the stored data file; displaying the generated machine-readable representation of data on a display of the test or measurement instrument; scanning the displayed machine-readable representation of data using a separate scanning device; decoding the address information contained in the scanned machine-readable representation of data by the scanning device; and downloading the stored data file from the test or measurement instrument via a network interface.

The present invention is based on the concept of transferring data, such as test or measurement data, automatically to other ethernal devices using a machine-readable representation of data on the display of the test or measurement instrument. For this purpose, a user has only to scan the displayed machine-readable representation of data by means of a suitable scanning device and after decoding the data may be downloaded to the scanning device or any other target device via a network interface. No setup or computer knowledge of the user is needed for this downloading and data transferring process, so that user comfortable downloading and data transferring mechanism is provided.

Advantageous configurations and developments emerge from the further dependent claims and from the description with reference to the figures of the drawings.

In a preferred embodiment, the machine-readable representation of data is a barcode. A barcode (or bar code) is a machine-readable optical label that contains information about the item to which it is attached. Some sorts of simple barcodes systematically represent data by varying the widths and spacings of parallel lines, and may be referred to as linear or one-dimensional barcodes. Two-dimensional (2D) variants of barcodes are using rectangles, dots, hexagons and other geometric patterns, called matrix codes or 2D barcodes, although they do not use bars as such. In a particularly preferred embodiment, the machine-readable representation of data is a QR code. A QR (quick response) code is a special type of a barcode which comprises a so-called matrix barcode or two-dimensional barcode. In practice, QR codes often contain data for a locator, identifier, or tracker that points to a website or application. A QR code consists of black squares arranged in a square grid on a white background, which can be read by an optical scanning device such as a camera, and processed using Reed-Solomon error correction until the image can be appropriately interpreted. The required data is then extracted from patterns that are present in both horizontal and vertical components of the image. It goes without saying that instead of a QR code other types of linear or matrix barcodes may also be employed.

In a further preferred configuration, the machine-readable representation of data contains address information of a web server, such as a URL address. The URL (uniform resource locator), often referred to as web address, is a reference to an internal or external web resource that specifies its location in a network or a computer and a mechanism for retrieving it.

In a preferred development, the network interface is a wireless interface, such as a WLAN or radio interface.

However, the network interface may also be a wired interface, for example for connecting a data cable to the test instrument. The network may be a wired network, such as a LAN, a cloud based network, the internet or the like.

In a particularly preferred embodiment, the processing unit is configured to setup an internal web server for establishing a network connection to the external network device via the network interface. Preferably, the processing unit is setting up an Apache HTTP server or a NGINX web server which are the most common web server programs and which in addition are free software. However, also other web servers, such as Microsoft IIS, Google web server or any other web server software may be used. A web server refers to an application or instance that provides content to web enabled devices via different web protocols, such as Hypertext Transfer Protocol (HTTP). In particular, a web server is a server software—or hardware dedicated to running said software—that can satisfy world wide web (www) client requests. A web server can, in general, contain one or more websites. A web server processes incoming network requests over a suitable protocol, such as HTTP. The web server can then act as a form of a hotspot inside the test or measuring instrument for communication with the external network device.

According to an alternative configuration, the processing unit is configured to setup an internal client for establishing a network connection to an external web server via the network interface. This option is preferable if the external network device is not in the same network of the test or measuring instrument. In this case, the external web service has to be used for the communication between the test or measuring instrument and the external network device.

In a further embodiment, the internal web server and/or the client comprise a compression module. The compression module is configured to compress the data files before providing the address information (URL)/or and before the stored data is uploaded to the external device via the network interface. As such, a more efficient and quicker data transfer is provided In particular for larger data files.

In a preferred development, the processing unit further comprises a timer, preferably a settable timer. The processing unit is further configured to display the generated machine-readable representation of data on the display only for a predetermined time provided by the timer. This is particularly advantageous for security aspects.

In one preferred application, the test or measuring instrument comprises a test unit which is configured to measure and/or analyse an electrical signal, in particular a test signals.

In a typical development, the stored data file comprises at least one of the following information: a graphical representation of a measurement or test signal, such as a screenshot or a video of subsequent graphical images of the test or measuring signal; test or measurement data derived from the measurement or test signal, such as test data; a test report; reference waveforms; setup information of the test or measurement instrument. It goes without saying, that other information may also be stored in the memory.

In a particularly preferred aspect, the separate optical scanning device is a smart phone. This is in particular advantageous as the smartphone typically has an integrated camera and the ability of QR code reading. Further, the smart phone has a network interface to the internet or any other local or distributed network for automatically forwarding the downloaded data to another device. In an alternative application, the smart phone may also carries out the analysing and processing of the downloaded data files as it has also processing and computing resources.

The test or measurement instrument may preferably be an electronic test equipment, such as an oscilloscope, a frequency analyzer, a spectrum analyzer, network analyzer, signal generator, etc.

Where appropriate, the above-mentioned configurations and developments can be combined in any manner. Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

CONTENT OF THE DRAWINGS

The present invention is described in greater detail in the following on the basis of the embodiments shown in the schematic figures of the drawings, in which:

FIG. 3 shows a flow chart of an embodiment of a method according to the present invention;

FIG. 4 shows a block diagram of a further embodiment of a test instrument according to the present invention.

Figure 1:
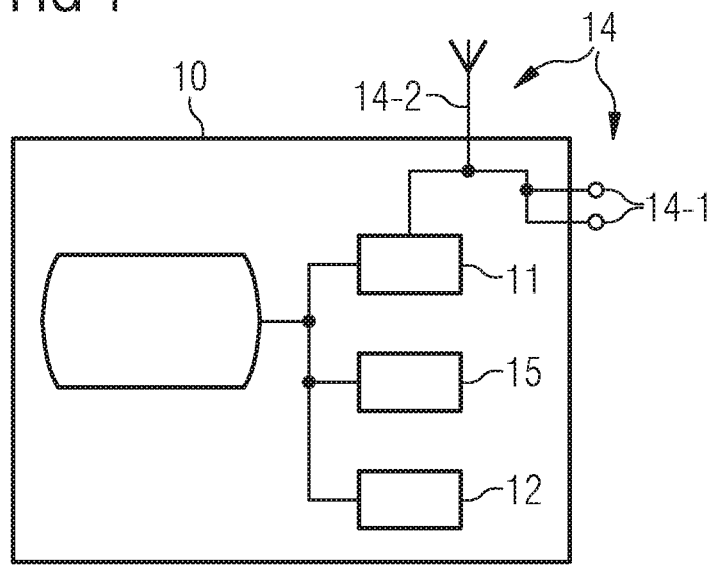
FIG. 1 shows a block diagram of an embodiment of a test or measurement instrument according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DESCRIPTION OF EMBODIMENTS

FIG. 1 shows a block diagram of an embodiment of a test or measurement instrument according to the present invention.

The test or measurement instrument in FIG. 1 is denoted by reference numeral 10. In the following, it is assumed that the instrument 10 is a test instrument, such as a network analyser, an oscilloscope, a spectrum analyser, etc.

The test instrument 10 comprises—amongst others—a test unit 11, a memory 12, a display 13, a network interface 14 and a processing unit 15.

The test unit 11 is configured to test a device under test (DUT) (not shown in FIG. 1) such as a cell phone, a radio transmitter, a radio receiver, etc. During a test mode, the test unit 11 is configured to analyse an electrical test signal gathered from or received by the device under test (DUT).

For data storage purposes, the electrical test signal or the data or parameter values derived from the electrical test signal may be stored as data files in a suitable memory 12. The memory may be a RAM, ROM, DRAM, a magnetic storage, such as a hard disk, an optical storage, such as a CD or DVD, etc. Additional content, such as setup data of the test instrument 10, graphical representations of the test signal, such as screenshots, etc. may also be stored in the memory 12.

The test instrument 10 comprises a display 13 which is configured to display a graphical representation of the test signal, reports of the analysis of the test signal, setup information, information of the used operation mode, user manual information, status information of the test instrument 10 and its components, the content stored in the memory, interface information, etc. Additionally, according to the invention the display 13 is configured the display a graphical representation of a machine-readable code, such as a barcode or a QR-code.

The test instrument 10 further comprises at least one network interface 14. The network interface 14 is used for connecting the test instrument 10 to another external network device (not shown in FIG. 1), to the DUT, to the internet, to a cloud, etc. In the example of FIG. 1, the network interface 14 comprises at least one wired network interface 14-1 and at least one wireless network interface 14-2.

The processing unit 15 may be any kind of programmable electronic circuit, such as a microprocessor, microcomputer, CPU, graphic processor, signal processor, FPGA, etc. The primary purpose of the processing unit 15 is to perform operations on some external data source, usually from a memory, a sensor or from any incoming data stream. The processing unit 15 is connected to the display 13, the memory 12 and the network interface 14. According to the present invention, the processing unit 15 generates a machine-readable representation of data which comprises encoded address information of at least one the data file stored in the memory 12.

Figure 2:
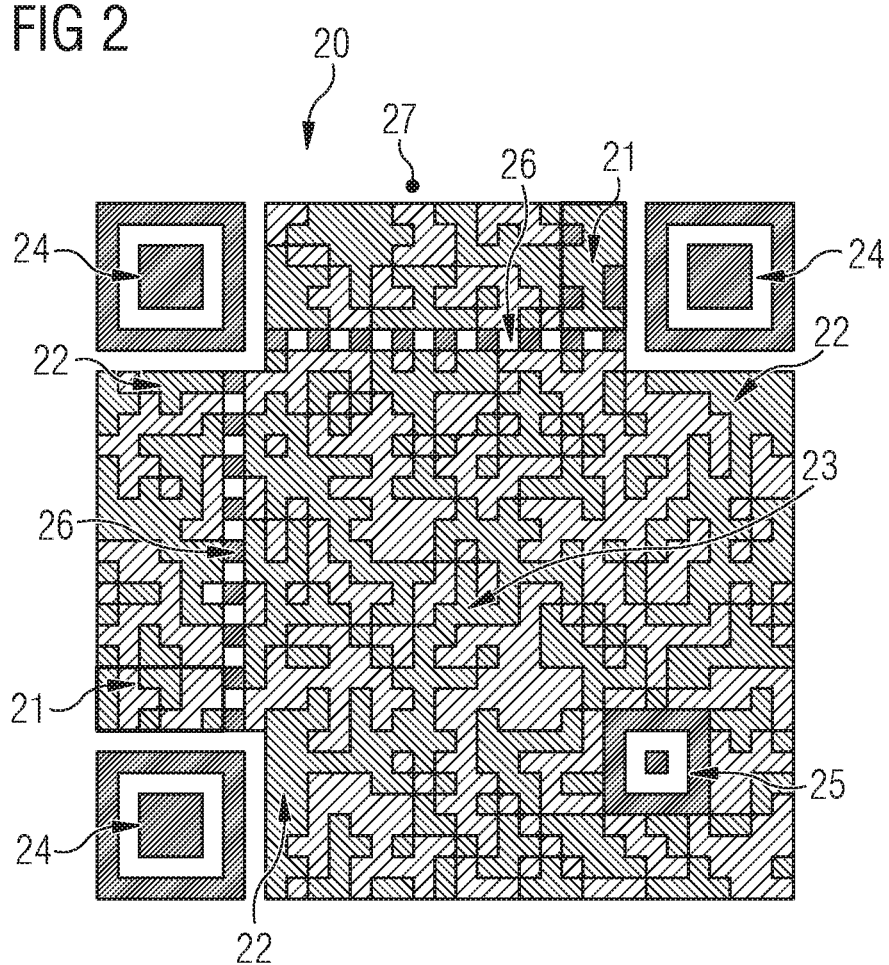
FIG. 2 shows the principal structure of a QR code.

The machine-readable representation of data generated by the processing unit 15 is according to one aspect of the invention a QR code 20. FIG. 2 shows such a QR code. The QR code 20 contains the version information 21 and the data format 22 used. The data part 23 contains the coded data in redundant form. For field delimitation, the QR code contains a specific pattern 24 in only three of its corners. The scanning device recognizes the orientation via the missing pattern in the fourth corner. As the size of the QR code 20 increases, more patterns 25 are added to make the orientation of the code more visible. Between the three main position marks there is a line 26 consisting of a sequence of strictly alternating bits over which the matrix is defined. This line is used for synchronization. The QR code matrix is surrounded by a so called quiet zone 27.

According to the present invention, the processing unit 15 in FIG. 1 further displays the generated machine-readable representation of data on the display 13 of the test instrument 10. An external network device which comprises a suitable scanning functionality is then able to scan the displayed machine-readable representation of data. After decoding the scanned address information encoded in the displayed machine-readable representation of data, the external network device is then able to download the at least one data file stored at the decoded address in the memory 12 via the network interface 14.

Preferably the network interface 14 used for downloading the data files is the wireless interface 14-2 since in this case no plugging has to be made and the downloading process is the executed fully automatically.

FIG. 3 shows a flow chart of an embodiment of a method according to the invention for enabling a network device to downloaded data stored in a test or measurement instrument.

In a first step S1, at least one data file is stored in the test or measurement instrument.

In a second step S2, a machine-readable representation of data, such as a barcode or QR code, is generated. The generated machine-readable representation of data comprises encoded address information of the stored data file.

In a next step S3, the generated machine-readable representation of data is displayed on a display of the test or measurement instrument.

This displayed machine-readable representation of data can then be scanned using a separate optical scanning device (step S4)

Thereafter, the address information contained in the scanned machine-readable representation of data is decoded, preferably by the scanning device (step S5).

In a final step S6, after decoding the address information, the stored data file may then be downloaded from the test or measurement instrument via a network interface.

FIG. 4 shows a block diagram of a further embodiment of a test instrument according to the present invention.

In addition to the embodiment shown in FIG. 1, the test instrument 10 in FIG. 4 comprises an internal web server 30, a client 31, a timer 32 and a compression unit 33. The DUT which is tested by the test instrument 10 is denoted by reference numeral 34 and the external network device is denoted by reference numeral 35.

The external network device 35 is in this embodiment a smart phone having a scanning functionality, in particular a scanning function for scanning a QR code. However, it is clear that any other device having a scanning function for scanning and decoding the displayed and scanned machine-readable representation of data would be usable either.

In this example, the processing unit 15 is configured to setup a web server 30, such as NGINX or Apache, for establishing a (wired or wireless) network connection to the external network device 35 via the network interface 14. In this case, the generated and displayed machine-readable representation of data contains address information of the web server 30. This aspect of the present invention applies for applications where as well the external network device 35 and the test instrument 10 and its web server 30 are in the same network.

In another aspect, an internal client 31 may also be used for data transfer of the stored data files. This aspect applies in particular for those applications, where the external network device 35 and the test instrument 10 are not in the same network. In this case, the client 31 of the test instrument 10 uploads the stored data files to a preconfigured external web service 36, such as DropBox, Box, AWS, etc. The processing unit 15 within the test instrument 10 then generates the machine-readable representation of data which comprises address information (e.g. the URL) for the external web service 36.

The test instrument 10 further comprises a compression module 33. The compression module 33 is used for compressing the data to be uploaded to an external server or network device 35 via the network interface 14. This accelerates and simplifies data transfer in particular in case large data files have to be uploaded. The compression module 33 may be implemented in the web server 30 and/or the client 31.

The test instrument 10 and in particular its processing unit 15 comprises a timer 32. The timer 32 can be used to set a time period within which the display 13 displays the generated machine-readable representation of data. After the predetermined time period set by the timer 32, the displayed machine-readable representation of data disappears again.

This is advantageous in particular for security reasons since this prevents that any not authorized user downloads the stored data files after having scanned the displayed machine-readable representation of data.

Although the present invention has been described in the above by way of preferred embodiments, it is not limited thereto, but rather can be modified in a wide range of ways. In particular, the invention can be changed or modified in various ways without deviating from the core of the invention.

LIST OF REFERENCE SIGNS 10 test instrument, measurement instrument
11 test unit
12 memory
13 display
14 network interface
14-1 wired network interface
14-2 wireless network interface
15 processing unit
20 QR code
21 version information
22 data format
23 data part, coded data
24 specific pattern for field delimitation
25 pattern for orientation of the code
26 synchronisation data
27 quiet zone
30 web server
31 client
32 timer
33 compression unit
34 device under test, DUT
35 external network device, smart phone
36 external web server
S1-S6 method steps

I claim:

1. A test or measurement instrument, the test or measurement instrument comprising:
   a test unit configured to test a device under test and further configured to provide at least one data file which is derived front the testing of the device under test,
   a memory configured to store the at least one data file;
   a display configured to display a machine-readable representation of data;
   a network interface for connecting the test or measurement instrument to another network device; and
   a processing unit connected to the display, the memory and the network interface, wherein the processing unit is configured to generate a machine-readable representation of data which comprises encoded address information of the data file stored in the memory and wherein the processing unit is further configured to display the generated machine-readable representation of data on the display for enabling the network device to download the stored data file via the network interface after having scanned the displayed machine-readable representation of data and decoded the address information.

2. The instrument of claim 1 wherein the machine-readable representation of data is a barcode.

3. The instrument according to claim 2 wherein the machine-readable representation of data is a QR code.

4. The instrument of claim 1 wherein the machine-readable representation of data contains address information of a web server.

5. The instrument of claim 1 wherein the network interface is a wireless interface.

6. The instrument of claim 1 wherein the processing unit is configured to setup a web server for establishing a network connection to the network device via the network interface.

7. The instrument of claim 6 wherein at least one of the web server or the client comprises a compression module and wherein the compression module is configured to compress the data to be uploaded via the network interface.

8. The instrument of claim 1 wherein the processing unit is configured to setup a client for establishing a network connection to an external web server via the network interface.

9. The instrument of claim 1 wherein the processing unit further comprises a timer and wherein the processing unit is further configured to display the generated machine-readable representation of data on the display only for a predetermined time.

10. The instrument of claim 1 wherein the stored data file comprises at least one of:
    a graphical representation of a measurement or test signal;
    test or measurement data derived from the measurement or test signal;
    a test report;
    reference waveforms;
    setup information of the test or measurement instrument.

11. A method for enabling a network device or an external web service to downloaded data stored in a test or measurement instrument, the method comprising the steps of:
    testing a device under:
    providing at least one data file which is derived from the testing of the device under test, storing the at least one data file in the test or measurement instrument;
    generating a machine-readable representation of data which comprises encoded address information of the stored data file;
    displaying the generated machine-readable representation of data on a display of the test or measurement instrument;
    scanning the displayed machine-readable representation of data using a separate optical scanning device;
    decoding the address information contained in the scanned machine-readable representation of data by the scanning device; and
    downloading the stored data file from the test or measurement instrument via a network interface.

12. The method of claim 11 wherein the separate optical scanning device is a smart phone.

13. The method of claim 11 wherein the machine-readable representation of data is a barcode or a QR code.

14. The method of claim 11 wherein the data file comprises at least one of:
    a graphical representation of a measurement or test signal;
    test or measurement data derived from the measurement or test signal;
    setup information of the test or measurement instrument.

15. The method of claim 11 wherein the machine-readable representation of data contains address information of a web server.

16. The method of claim 11, further comprising:
    setting up a web server for establishing a network connection to the network device via the network interface.

17. The method of claim 11, further comprising:
    setting up a client for establishing a network connection to the network device via the network interface.

18. The method of claim 11 wherein the generated machine-readable representation of data is displayed only for a predetermined time.

\* \* \* \* \*